United States Patent [19]
Takeuchi et al.

[11] Patent Number: 5,681,410
[45] Date of Patent: Oct. 28, 1997

[54] METHOD OF PRODUCING A PIEZOELECTRIC/ELECTROSTRICTIVE ACTUATOR

[75] Inventors: Yukihisa Takeuchi, Aichi-ken; Koji Kimura, Nagoya, both of Japan

[73] Assignee: NGK Insulators, Ltd., Japan

[21] Appl. No.: 13,046

[22] Filed: Feb. 4, 1993

Related U.S. Application Data

[62] Division of Ser. No. 734,695, Jul. 23, 1991, Pat. No. 5,210,455.

[30] Foreign Application Priority Data

Jul. 26, 1990 [JP] Japan .................................. 2-198374
Feb. 19, 1991 [JP] Japan .................................. 3-45982

[51] Int. Cl.$^6$ .................................................. C04B 37/00
[52] U.S. Cl. .................................................. 156/89; 427/100
[58] Field of Search .......................... 156/89, 293, 298, 156/303.1; 29/25.35; 310/311, 340, 348, 351, 352; 427/100

[56] References Cited

U.S. PATENT DOCUMENTS

| | | | |
|---|---|---|---|
| 2,540,194 | 2/1951 | Ellett | 171/327 |
| 3,509,387 | 4/1970 | Thorn et al. | 310/8.3 |
| 3,725,186 | 4/1973 | Lynch | 156/89 |
| 3,754,153 | 8/1973 | Carpenter et al. | 310/352 |
| 4,216,401 | 8/1980 | Wagner | 310/313 R |
| 4,456,850 | 6/1984 | Inoue et al. | 310/324 |
| 4,491,761 | 1/1985 | Grudkowski et al. | 310/359 |

(List continued on next page.)

FOREIGN PATENT DOCUMENTS

| | | |
|---|---|---|
| 0262637 | 4/1988 | European Pat. Off. . |
| 0408305 | 1/1991 | European Pat. Off. . |
| 2570223 | 3/1986 | France . |
| 44-20437 | 9/1969 | Japan . |
| 59-32182 | 2/1984 | Japan . |
| 59-175777 | 10/1984 | Japan . |
| 61-253873 | 11/1986 | Japan . |
| 62-213399 | 9/1987 | Japan . |
| 62-298189 | 12/1987 | Japan . |
| 62-298190 | 12/1987 | Japan . |
| 63-72171 | 4/1988 | Japan . |
| 63-72172 | 4/1988 | Japan . |
| 63-285983 | 11/1988 | Japan . |
| 64-783 | 1/1989 | Japan . |
| 3-128680 | 5/1991 | Japan . |
| 3-128681 | 5/1991 | Japan . |
| 2161647 | 1/1986 | United Kingdom . |
| 89/07259 | 8/1989 | WIPO . |

OTHER PUBLICATIONS

IBM Technical Disclosure Bulletin, vol. 30, No. 7, Dec. 1987, pp. 442–443 "Reliable Multilaminate Bender".
Patent Abstracts of Japan, vol. 9, No. 165 (E–327) 10 Jul. 1985.
Patent Abstracts of Japan, vol. 8, No. 201 (M–325) 14 Sep. 1984.
Sabo et al., "The use of Low Temperature . . . " Journal of Am Cer. Soc. vol. 26. 1988 pp. 217–228.
Brady et al., Materials Handbook 1986 (* cited in previous office action—applicant did not recieve—see paper #11, p. 2.

*Primary Examiner*—Christopher A. Fiorilla
*Attorney, Agent, or Firm*—Parkhurst, Wendel & Burr, L.L.P.

[57] ABSTRACT

A method of producing a piezoelectric/electrostrictive actuator including a ceramic substrate and a piezoelectric/electrostrictive portion, including the steps of: superposing on each other a first and a second green sheet which give, by firing thereof, a first layer and a second layer of ceramic substrate, respectively, the first green sheet having at least one opening formed through a thickness thereof; firing the first and second green sheets to form the ceramic substrate such that the second layer cooperates with the at least one opening in the first layer to define at least one recess which has a bottom surface defining a thin-walled portion of the ceramic substrate; and forming the piezoelectric/electrostrictive portion on the thin-walled portion of the ceramic substrate.

6 Claims, 7 Drawing Sheets

U.S. PATENT DOCUMENTS

| | | | |
|---|---|---|---|
| 4,556,812 | 12/1985 | Kline et al. | 310/324 |
| 4,564,851 | 1/1986 | Nilsson et al. | 346/140 R |
| 4,633,120 | 12/1986 | Sato et al. | 310/328 |
| 4,638,206 | 1/1987 | Tsunooka et al. | 310/313 B |
| 4,649,313 | 3/1987 | Ogawa et al. | 310/358 |
| 4,677,336 | 6/1987 | Kushida et al. | 310/334 |
| 4,680,595 | 7/1987 | Cruz-Uribe et al. | 346/140 R |
| 4,719,383 | 1/1988 | Wang et al. | 310/324 |
| 4,742,260 | 5/1988 | Shimizu et al. | 310/323 |
| 4,742,264 | 5/1988 | Ogawa | 310/332 |
| 4,769,570 | 9/1988 | Yokoyama et al. | 310/332 |
| 4,780,639 | 10/1988 | Shirasu | 310/328 |
| 4,783,321 | 11/1988 | Spence | 422/300 |
| 4,806,188 | 2/1989 | Rellick | 156/89 |
| 4,812,698 | 3/1989 | Chida et al. | 310/330 |
| 4,825,227 | 4/1989 | Fischbeck et al. | 346/1.1 |
| 4,833,000 | 5/1989 | Trickett et al. | 156/89 |
| 4,848,643 | 7/1989 | Frische et al. | 228/121 |
| 4,906,840 | 3/1990 | Zdeblick et al. | 250/306 |
| 5,075,641 | 12/1991 | Weber et al. | 331/108 C |
| 5,089,071 | 2/1992 | Tominaga et al. | 156/89 |
| 5,176,771 | 1/1993 | Bravo et al. | 156/85 |

METHOD OF PRODUCING A PIEZOELECTRIC/ELECTROSTRICTIVE ACTUATOR

This is a Division of application Ser. No. 07/734,695 filed Jul. 23, 1991, now U.S. Pat. No. 5,210,455.

BACKGROUND OF THE INVENTION

1. Field of the Invention

The present invention relates to a uni-morph, bi-morph or other types of piezoelectric or electrostrictive actuator which undergo displacement in the form of bending, deflection or flexure and which can be used for ink jet print heads, microphones, sounding bodies (such as speakers), various transducers and other components or devices. The term "actuator" used herein is an element or member capable of transducing or converting an electric energy into a mechanical energy, i.e., a mechanical force, displacement or strain.

2. Discussion of the Prior Art

In recent years, an element whose displacement can be controlled has been widely used and increasingly demanded in the fields of optics and precision positioning or machining operations, for example, for adjusting or controlling an optical path length or the position of a member or component of a device, on the order of fractions of a micron (μm). To meet this need, there have been developed various piezoelectric or electrostrictive actuators utilizing a piezoelectric or electrostrictive material such as a ferroelectric material, which exhibits the reverse or converse piezoelectric effect or the electrostrictive effect, in which such a piezoelectric or electrostrictive material produces a mechanical displacement upon application of a voltage or electric field thereto.

For example, an ink jet print head uses a piezoelectric/electrostrictive actuator of a conventional uni-morph or bi-morph type, which is required to permit a high-quality high-speed printing operation. To this end, developments have been made to reduce the size and required drive voltage of the piezoelectric/electrostrictive actuator, and improve the operating response of the actuator.

A piezoelectric or electrostrictive element of such an actuator is carried by a substrate, which functions as an oscillator or transducer plate. For assuring sufficient amount and force of bending or flexural displacement of the substrate or plate, it is important to reduce the thickness of the substrate, on the one hand. On the other hand, however, the reduction in the substrate thickness undesirably results in a decrease in the mechanical strength of the substrate.

SUMMARY OF THE INVENTION

It is therefore an object of the present invention to provide a piezoelectric/electrostrictive actuator which undergoes a sufficient amount of displacement and generates a large force by application of a relatively low voltage, and which has improved strength and excellent operating response and reliability and is suitably used for ink jet print heads, microphones, sounding bodies (such as speakers), and other transducers.

The second object of the invention is to provide such a piezoelectric/electrostrictive actuator suitable for providing a highly integrated actuator assembly.

The above objects may be accomplished according to the principle of the present invention, which provides a piezoelectric/electrostrictive actuator including a ceramic substrate and a piezoelectric/electrostrictive portion, wherein the ceramic substrate has at least one recess having a bottom surface which defines a thin-walled portion, and the piezoelectric/electrostrictive portion is formed on the thin-walled portion of the ceramic substrate.

The above objects may also be accomplished according to another aspect of the present invention, which provides a method of producing a piezoelectric/electrostrictive actuator including a ceramic substrate and a piezoelectric/electrostrictive portion, the method comprising the steps of: superposing on each other a first and a second green sheet which give, by firing thereof, a first layer and a second layer of the ceramic substrate, the first green sheet having at least one opening formed through a thickness thereof; firing the first and second green sheets to thereby form the ceramic substrate such that the second layer cooperates with the at least one the first layer to define at least one recess which has a bottom surface defining a thin-walled portion of the ceramic substrate; and forming the piezoelectric/electrostrictive portion on the thin-walled portion of the ceramic substrate.

In the present piezoelectric/electrostrictive actuator, the piezoelectric/electrostrictive portion which may consist of a plurality of laminated films (two electrode film and a piezoelectric/electrostrictive film interposed therebetween) is formed on the thin-walled portion of the ceramic substrate. Accordingly, the present actuator provides a relatively large amount of displacement with a relatively large magnitude of force generated, and has an improved operating response. Since the piezoelectric/electrostrictive portion may be easily formed in the form of electrode and piezoelectric/electrostrictive films or patterns on the ceramic substrate, any desired number of piezoelectric/electrostrictive units may be integrated on a single substrate to form a highly integrated piezoelectric/electrostrictive actuator assembly.

The ceramic substrate is formed by firing the first and second green sheets which are superposed on each other such that the opening or openings formed in the first green sheet is/are closed at one surface of the first green sheet. The fired first and second green sheets give the respective first and second laminated layers of the substrate, in which at least one recess is formed corresponding to the opening or openings, thereby defining the thin-walled portion of the substrate on which the piezoelectric-electrostrictive portion is formed. Thus, the only the portion of the ceramic substrate which is subject to the piezoelectric/electrostrictive displacement is thin-walled, to reduce the drive voltage for obtaining the desired amount of displacement with a high operating response, without lowering the mechanical strength of the substrate. Further, this arrangement is suitable for providing a small-sized integrated piezoelectric/electrostrictive actuator assembly wherein a desired number of piezoelectric/electrostrictive portions are provided as piezoelectric/electrostrictive actuator units on a single ceramic substrate. In this case, the adjacent actuator units formed on the respective thin-walled portions of the ceramic substrate will not interfere with each other when these units are displaced with the thin-walled portions, since the adjacent thin-walled portions of the substrate are more or less spaced apart from each other by relatively thick-walled portions of the substrate. Accordingly, the thin-walled portions will not significantly reduce the overall mechanical strength of the substrate, even where the substrate is used for carrying a highly integrated assembly of piezoelectric/electrostrictive units.

In particular, the openings are formed through only those portions of the first green sheet which correspond to the thin-walled portions of the substrate that function as oscillator or transducer plates to be displaced upon energization of the respective piezoelectric/electrostrictive portions or units. With the first and second green sheets fired into the integral laminar substrate, the openings provide respective recesses that define the respective thin-walled portions of the substrate. This arrangement is effective to assure an overall mechanical strength sufficient for supporting thereon multiple piezoelectric/electrostrictive portions of a highly integrated actuator assembly, while assuring functionality of the piezoelectric/electrostrictive portions. In addition, the ceramic substrate obtained by firing the first and second green sheets (or green tapes) has a highly reliable laminar structure, which consists of the first layer having the recess corresponding to the opening, and second layer which has the thin-walled portion corresponding to the recess.

For permitting the present actuator to provide a large amount of displacement or generate a large magnitude of force with a relatively low voltage applied thereto, it is desirable that the piezoelectric/electrostrictive portion has a thickness not larger than 100 µm, preferably not larger than 50 µm, and the thin-walled portion of the substrate has a thickness not larger than 50 µm, preferably not larger than 30 µm.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
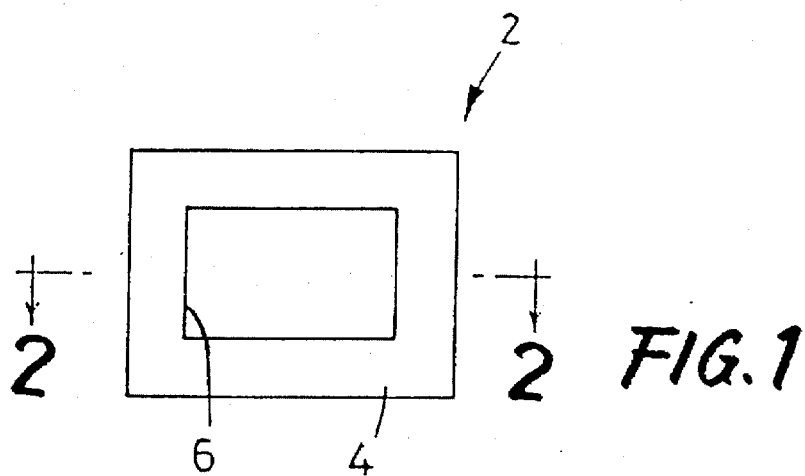
FIG. 1 is a bottom plan view of one example of a ceramic substrate used for a piezoelectric/electrostrictive actuator embodying the present invention.

To further clarify the concept of the present invention, presently preferred forms of the piezoelectric/electrostrictive actuator of the invention will be described by reference to the accompanying drawings, in which the same reference numerals are used to identify structurally or functionally identical or similar components or elements.

Figure 2:
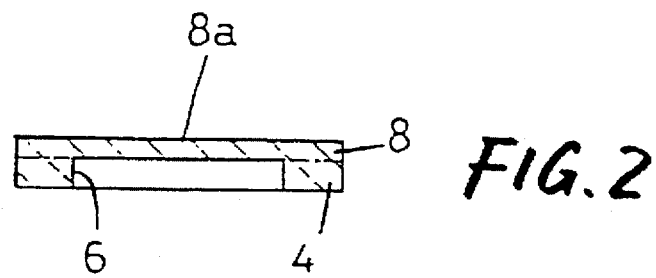
FIG. 2 is a cross sectional view taken along line 2—2 of FIG. 1.

Referring first to FIGS. 1 and 2, a ceramic substrate 2 used for a piezoelectric/electrostrictive actuator of the invention consists of a first layer 4 and a second layer 8 which are integrally laminated on each other and cooperate to define a rectangular recess 6. These first and second layers 4, 8 are formed by firing a first green sheet having an opening in the form of a rectangular aperture corresponding to the recess 6, and a second green sheet which is formed on the first green sheet such that the second green sheet closes the opening at one of the opposite major surfaces thereof. The two superposed green sheets are co-fired into the integral ceramic substrate 2. The recess 6 has a bottom surface which defines a thin-walled portion 8a of the substrate 2, which is surrounded by a thick-walled peripheral portion. Namely, the peripheral portion of the second layer 8 is reinforced by the first layer 4.

Figure 3:
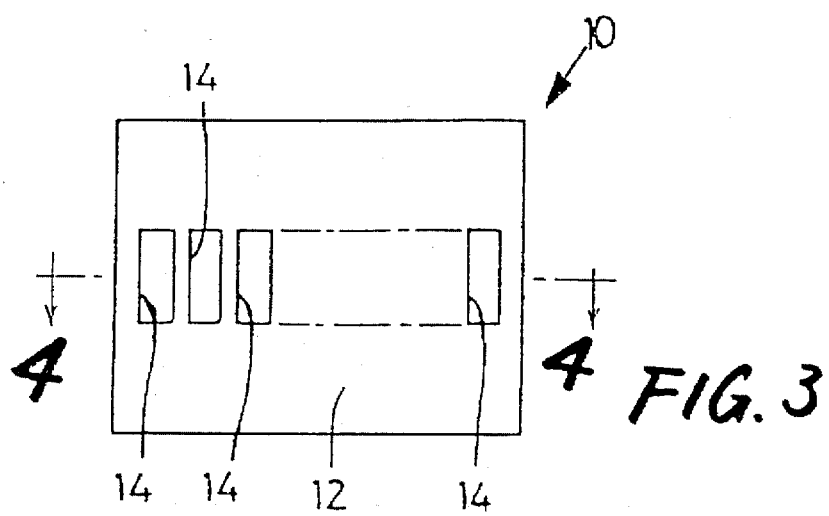
FIG. 3 is a bottom plan view of another example of the ceramic substrate for the actuator of the invention.
Figure 4:
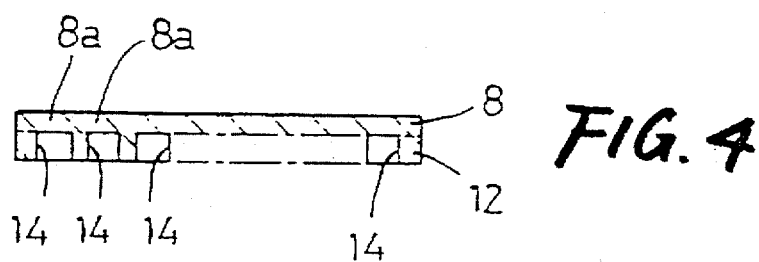
FIG. 4 is a cross sectional view taken along line 4—4 of FIG. 3.

A ceramic substrate 10 shown in FIGS. 3 and 4 has a first layer 12 which has a configuration different from that of the first layer 4 of the substrate 2 of FIGS. 1 and 2. That is, the first layer 12 is formed by firing a first green sheet which has an array of openings in the form of parallel rectangular apertures arranged in spaced-apart relation with each other. The openings are closed at one major surface of the layer 12, by the second layer 8 formed by firing a second green sheet. Thus, parallel recesses 14 corresponding to the openings are formed in the substrate 10. The recesses 14 define respective thin-walled portions 8a of the substrate 10 on which respective piezoelectric/electrostrictive actuator units are formed. In other words, the thin-walled portions 8a define the bottom of each recess 14.

Figure 5:
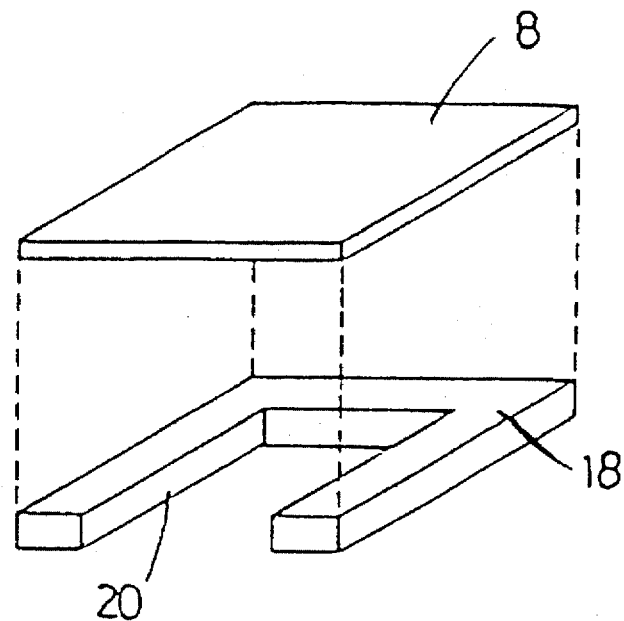
FIG. 5 is an exploded perspective view showing a first and a second green sheet for forming a further example of the ceramic substrate.
Figure 6:
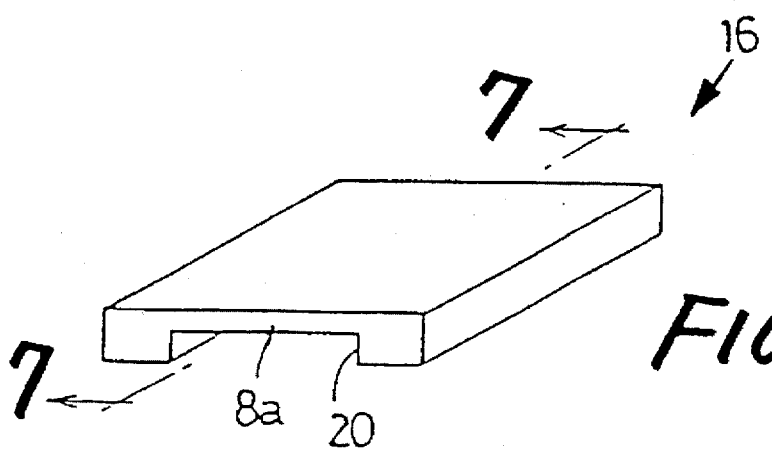
FIG. 6 is a perspective view showing the ceramic substrate consisting of first and second layers formed by firing of the green sheets of FIG. 5.
Figure 7:
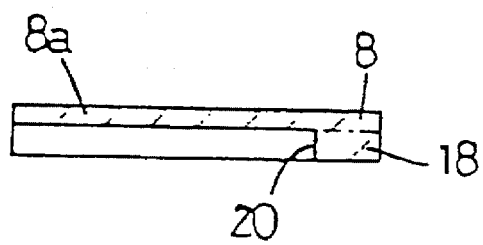
FIG. 7 is a cross sectional view taken along line 7—7 of FIG. 6.

Referring next to FIGS. 5–7, a ceramic substrate 16 has a U-shaped first layer 18 which is formed by firing a first green sheet. The first green sheet has an opening in the form of a rectangular cutout open sideways at one of its four sides. The opening is closed by the second layer 8 which is formed by firing a second green sheet, whereby the substrate 16 consisting of the first and second layers 18, 8 has a rectangular recess 20 corresponding to the opening. In the presence of the recess 20, the substrate 16 has the thin-walled portion 8a on which there is formed a piezoelectric/electrostrictive portion of an actuator. The thin-walled portion 8a is surrounded by the U-shaped reinforcing thick-walled peripheral portion, i.e., the first layer 18. In the present substrate 16, the recess 20 is open sideways parallel to the plane of the thin-walled portion 8a, as well as in the direction perpendicular to the portion 8a, contrary to the recesses 6, 14 of the substrates 2, 10 which are not open sideways.

Figure 8:
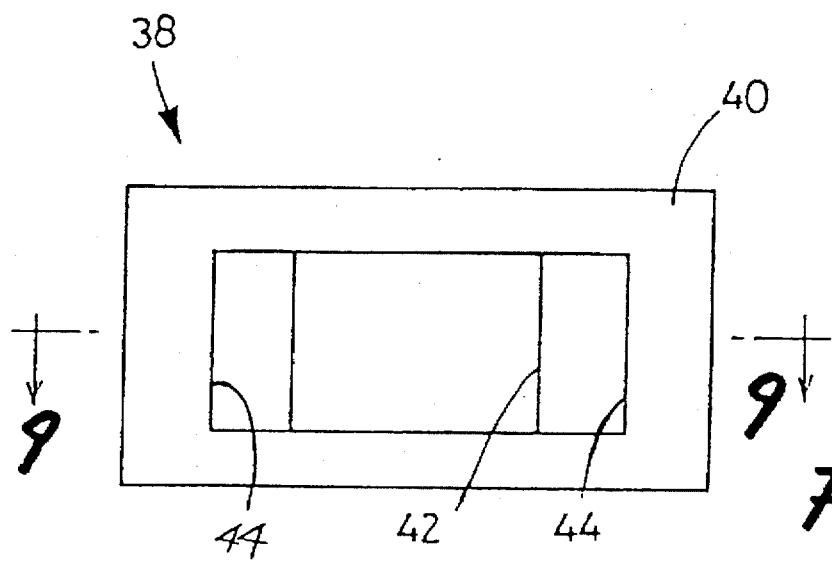
FIG. 8 is a bottom plan view of a still further example of the ceramic substrate.
Figure 9:
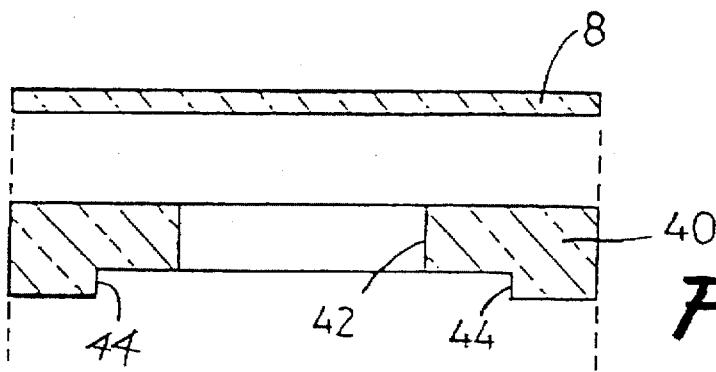
FIG. 9 is an exploded cross sectional view taken along line 9—9 of FIG. 8, showing a first and a second greet sheet which are fired into respective first and second layers of the ceramic substrate of FIG. 8.
Figure 10:
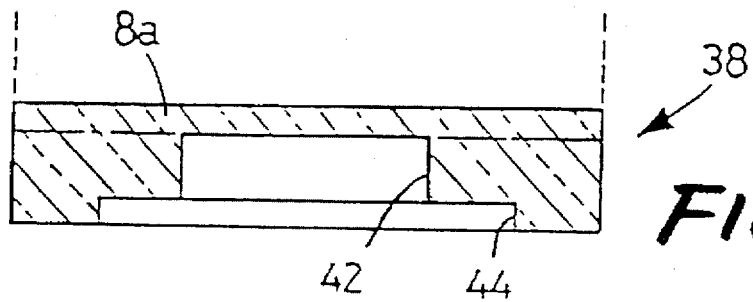
FIG. 10 is a cross sectional view showing the ceramic substrate consisting of the two layers formed by firing of the green sheets of FIG. 9.

A ceramic substrate 38 shown in FIGS. 8–10 has a first layer 40 which cooperates with the second layer 8 to define a rectangular recess 42 and thereby define the thin-walled portion 8a, on which is formed a piezoelectric/ electrostrictive portion. Further, the first layer 40 has two stepped portions 44 on one of the opposite major surfaces remote from the second layer 8. These stepped portions 44 are formed adjacent to the longitudinally opposite ends of the recess 42, and are used for a passage for delivering an ink from an ink reservoir, when an ink jet nozzle of an ink jet print head is attached to the substrate 38.

Thus, the ceramic substrates 2, 10, 16, 40 constructed as described above are thin-walled only at their portions (8a) which are displaced together with a piezoelectric/electrostrictive portion of an actuator. Accordingly, the substrates have a sufficient overall mechanical strength, while at the same time assuring excellent functioning as a transducer, and can be suitably used for an integrated piezoelectric/electrostrictive actuator assembly in which a large number of actuator units are formed on a single substrate. Further, the substrates have high heat resistance and operating reliability, since they are refractory laminar structures formed by firing ceramic green sheets.

There are illustrated in FIGS. 11–16 several embodiments of the piezoelectric/electrostrictive actuator of the present invention, each of which uses a ceramic substrate having a laminar structure constructed as described above.

Figure 11:
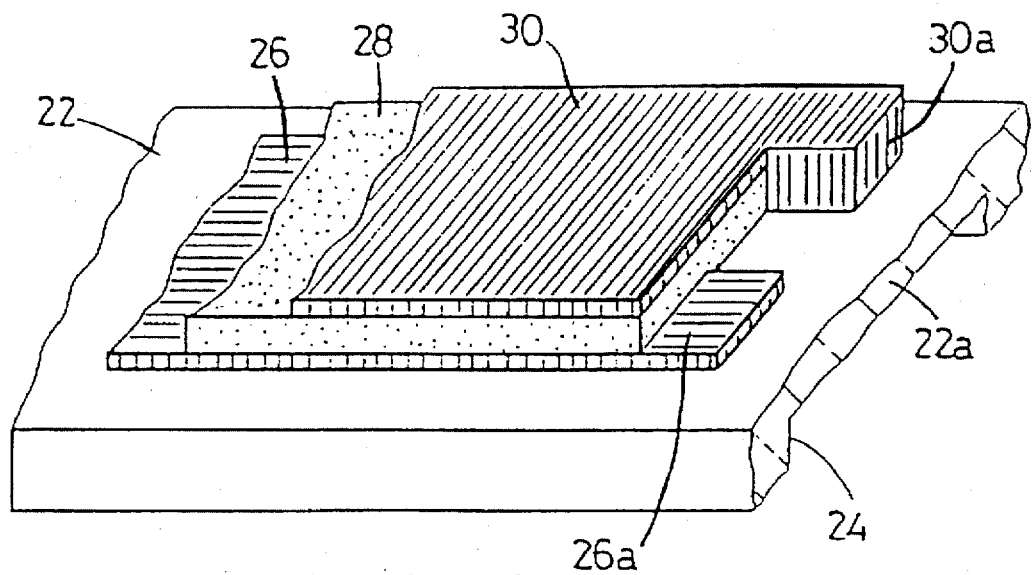
FIG. 11 is a fragmentary perspective view of one embodiment of the piezoelectric/electrostrictive actuator of the invention.

Referring first to FIG. 11, the piezoelectric/electrostrictive actuator includes a ceramic substrate 22 having a recess 24 whose bottom surface defines a thin-walled portion 22a. On one of the opposite surfaces of the thin-walled portion 22a remote from the recess 24, there is formed a piezoelectric/electrostrictive portion in the form of a laminar structure which consists of a first electrode film 26, a piezoelectric/electrostrictive film 28 and a second electrode film 30, which are laminated in the order of description. The first and second electrode films 26, 30 have respective terminal portions 26a, 30a which extend from one end of the piezoelectric/electrostrictive film 28. In operation of the actuator, a voltage is applied between the first and second electrode films 26, 30 through the terminal portions 26a, 30a, whereby the piezoelectric/electrostrictive film 28 is exposed to an electric field, and the actuator generates a force or undergoes displacement in the form of a bending or deflection, in the direction perpendicular to the plane of the ceramic substrate 22, due to the transverse mode of converse piezoelectric effect or electrostrictive effect.

Figure 12:
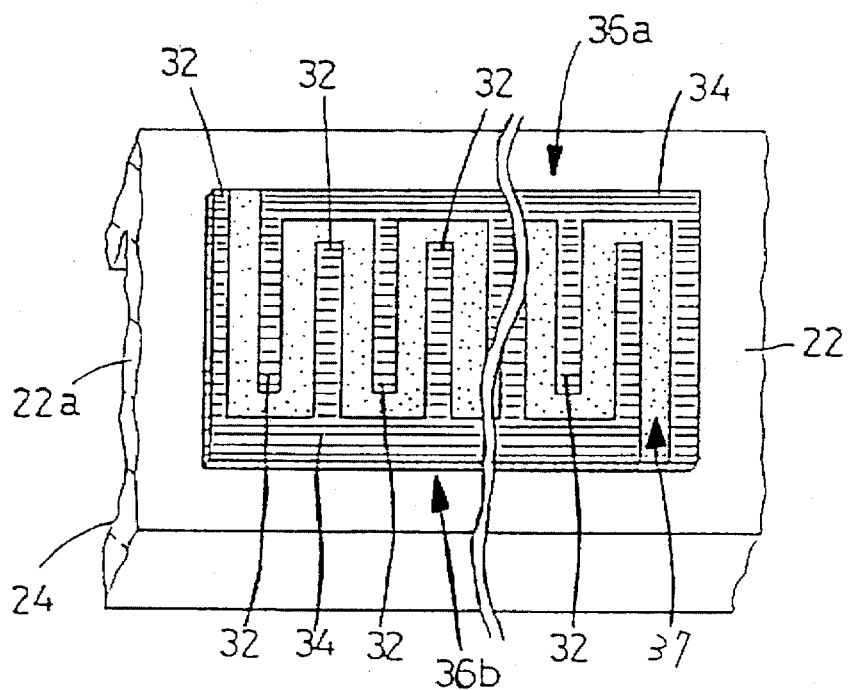
FIG. 12 is a fragmentary perspective view showing another embodiment of the actuator of the invention.

Another form of the piezoelectric/electrostrictive actuator is shown in FIG. 12, wherein a pair of comb-like electrode patterns 36a, 36b are formed on the thin-walled portion 22a of the ceramic substrate 22. Each electrode pattern 36a, 38a has a plurality of electrode strips 32 connected to each other by a connecting portion 34. Each electrode strip 32 of one of the two patterns 36a, 36b is disposed between the adjacent electrode strips 32 of the other pattern 36b, 36a, in spaced part relation with each other in the direction of extension of the connecting portions 34. Namely, the electrode strips 32 of the electrode pattern 36a and the strips 32 of the other electrode pattern 36b are disposed alternately in the direction of extension of the connecting portions 34. A piezoelectric/electrostrictive pattern 37 is also formed on the thin-walled portion 22a, such that a space formed between the two comb-like electrode patterns 36a, 36b is filled with a piezoelectric/electrostrictive material of the pattern 37, as shown in FIG. 12. Namely, the pattern 37 has piezoelectric/electrostrictive strips each of which is disposed between the adjacent electrode strips 32. Thus, the electrode strips 32 and the piezoelectric/electrostrictive strips are alternately disposed in contact with each other on the thin-walled portion 22a of the substrate 22. Upon application of an electric field to the piezoelectric/electrostrictive pattern 37, the thin-walled portion 22a is deflected or bent in the direction perpendicular to the plane of the substrate 22, due to the longitudinal mode of converse piezoelectric effect or electrostrictive effect.

Figure 13:
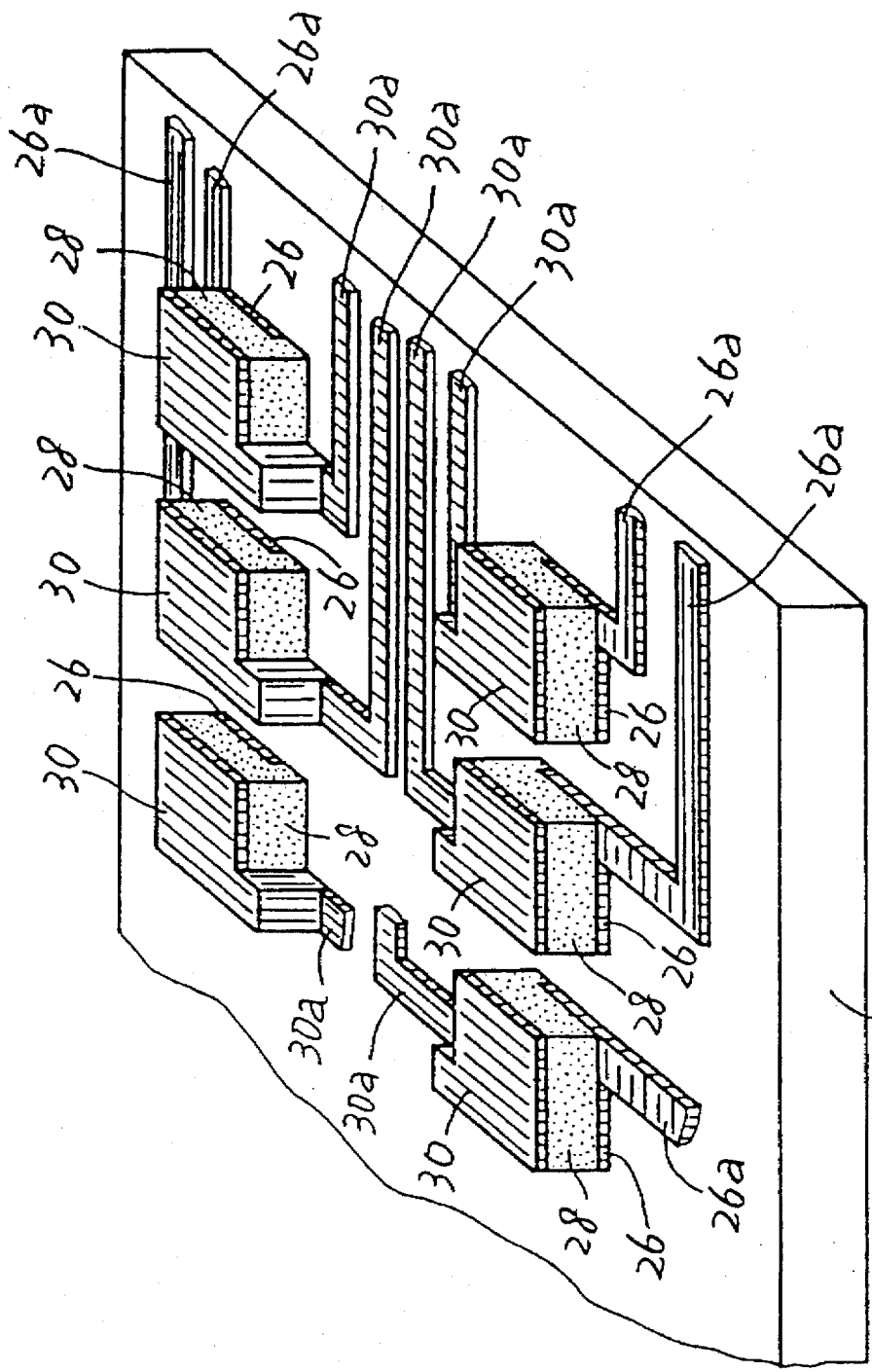
FIG. 13 is a fragmentary perspective view showing a further embodiment of the invention.

A piezoelectric/electrostrictive actuator shown in FIG. 13 is an example of a highly integrated piezoelectric/electrostrictive actuator, which has a piezoelectric/electrostrictive portion consisting of a multiplicity of piezoelectric/electrostrictive units formed on the ceramic substrate 22. Each of these units consists of the two electrode fills 26, 30 and the piezoelectric/electrostrictive fill 28 formed therebetween. Like the substrate 10 of FIGS. 3 and 4 which has the spaced-apart parallel recesses 14, the ceramic substrate 22 has arrays of parallel recesses which define respective thin-walled portions on which are formed the respective piezoelectric/electrostrictive units.

Figure 14:
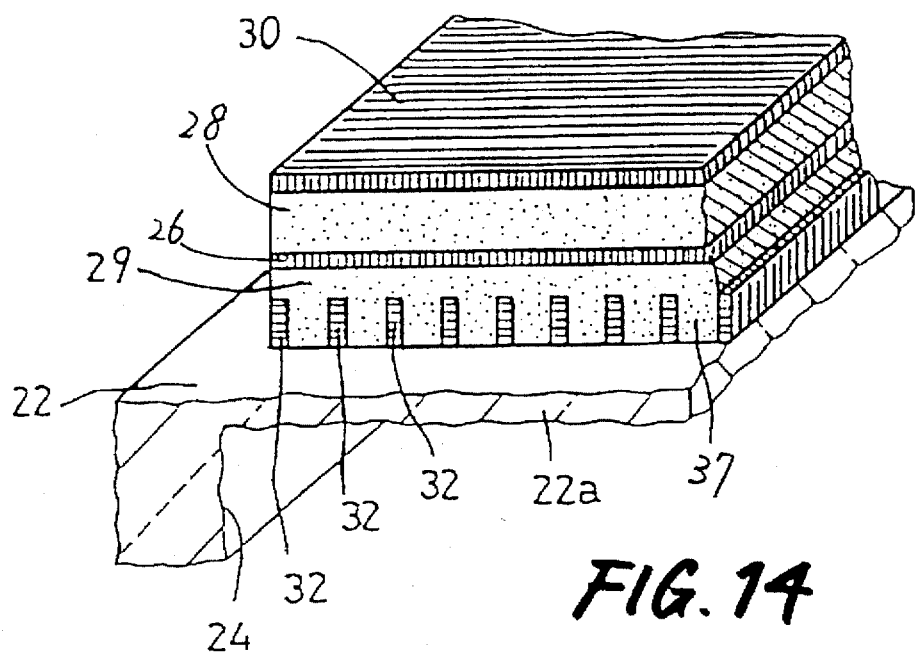
FIG. 14 is a fragmentary perspective view showing a still further embodiment of the invention.

In the piezoelectric/electrostrictive actuator of FIG. 14 according to a further embodiment of the invention, a piezoelectric/electrostrictive fill 29 is formed on one of the opposite surfaces of the thin-walled portion 22a of the ceramic substrate 22 which is remote from the recess 24. Within the fill 29, there are embedded a plurality of parallel electrode strips 32 similar to those of the electrode patterns 36a, 36b of FIG. 12, such that the electrode strips 32 are spaced apart from each other. With the electrode strips 32 embedded in the film 29, a piezoelectric/electrostrictive pattern 37 is formed such that the adjacent electrode strips 32 are spaced from each other by a piezoelectric/electrostrictive material of the pattern 37. On the fill 29, there are formed the first electrode film 26, piezoelectric/electrostrictive film 28 and second electrode film 30, which are similar to those of FIG. 11.

Figure 15:
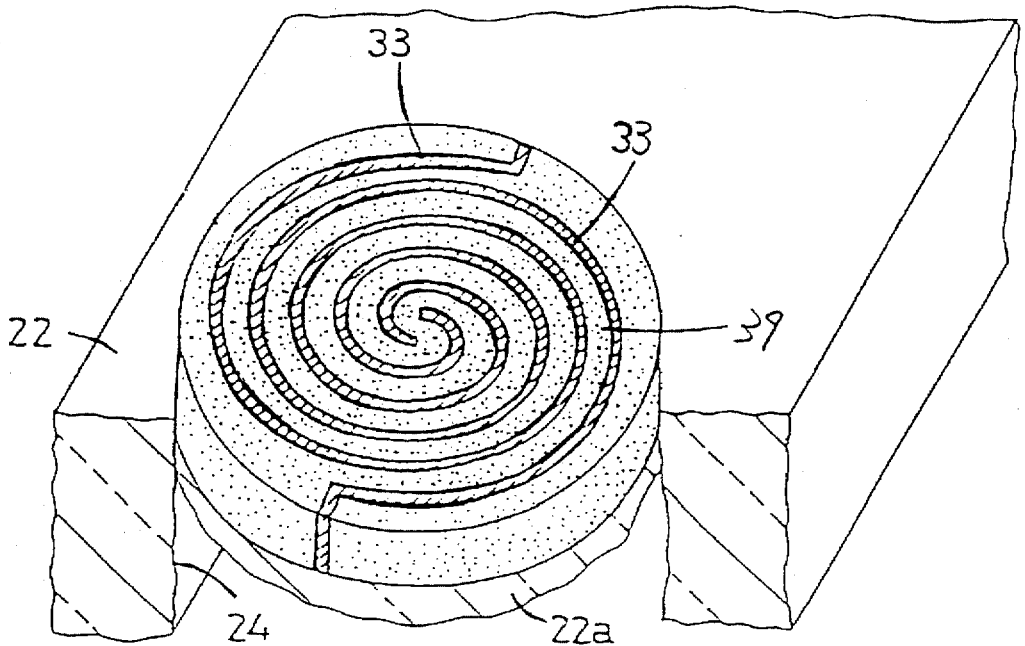
FIG. 15 is a fragmentary perspective view showing a yet further embodiment of the invention.

Referring to FIG. 15 showing a still further embodiment of the invention, the ceramic substrate 22 has a circular thin-walled portion 22a on which there is formed a circular piezoelectric/electrostrictive portion which consists of an electrode pattern 33 and a piezoelectric/electrostrictive pattern 39. The electrode pattern 33 consists of two spiral electrode strips defining two spiral spaces which are filled by the piezoelectric/electrostrictive material 39.

Figure 16:
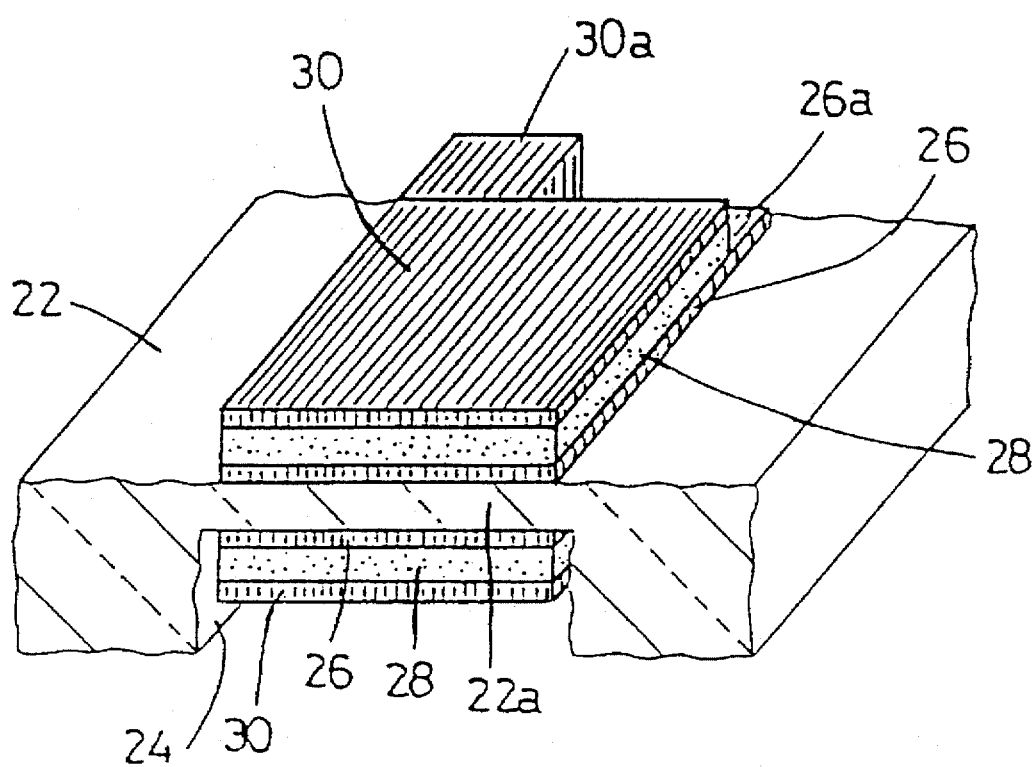
FIG. 16 is a fragmentary perspective view showing another embodiment of the invention.

A bi-morph type piezoelectric/electrostrictive actuator is illustrated in FIG. 16. This actuator has a piezoelectric/electrostrictive portion consisting of two piezoelectric/electrostrictive units, which are formed on the opposite surfaces of the thin-walled portion 22a of the substrate 22. Each piezoelectric/electrostrictive unit consists of the two electrode films 26, 30 and the piezoelectric/electrostrictive film 28 formed therebetween.

The piezoelectric/electrostrictive actuators constructed as described above are produced in the manner as described below.

The ceramic substrate (22) for carrying the piezoelectric/electrostrictive portion may be formed of an electrically insulating or dielectric material which has a sufficiently high mechanical strength, and which may be heat-treated at a temperature of about 1400° C. for integration with the piezoelectric/electrostrictive portion, preferably without using a bonding agent, as described below. The insulating or dielectric material may be an oxide or non-oxide ceramic composition, which preferably includes as a major component or components at least one of aluminum oxide, magnesium oxide, zirconium oxide, aluminum nitride and silicon nitride. These ceramic compositions enable the actuator to provide an increased amount of displacement and a better operating response, than other materials such as metal, glass and silicon. In particular, it is recommended to use a ceramic composition which includes as the major component or components aluminum oxide and/or zirconium oxide, preferably, zirconium oxide which is stabilized by at least one compound selected from the group consisting of: yttrium oxide; ytterbium oxide; cerium oxide; calcium oxide; and magnesium oxide. The use of the stabilized zirconium oxide for the ceramic substrate provides the following advantages: i) The substrate formed of the stabilized zirconium oxide has high degrees of mechanical strength and toughness; ii) Thermal stresses produced during heat-treatment of the stabilized zirconium oxide for integration with a laminar piezoelectric/electrostrictive material are relatively small; iii) The stabilized zirconium oxide undergoes a relatively small chemical reaction with the piezoelectric/electrostrictive material; and iv) The substrate formed with the recess according to the present invention is capable of easily undergoing a relatively large amount of displacement together with the piezoelectric/electrostrictive portion. It is preferable to partially stabilize the zirconium oxide by adding 1–30 mole % of yttrium oxide or ytterbium oxide, 6–50 mole % of cerium oxide, or 5–40 mole % of calcium oxide or magnesium oxide. It is particularly recommended to use yttrium oxide in an amount of 1.5–6 mole %, desirably 2–5 mole %. The crystal phase of the zirconium oxide partially stabilized by the yttrium oxide assures particularly excellent properties of the ceramic substrate. However, it is possible to fully stabilize the major component or components of the ceramic substrate.

The ceramic substrate preferably consists of a first layer (4, 12, 18, 40) and a second layer (8) which are formed, for example, by firing respective first and second green sheets. The first green sheet has at least one opening such as an aperture or cutout formed through its thickness, while the second green sheet is a planar layer which closes each opening at one of its opposite surfaces. With these green sheets fired, the laminated first and second layers are formed such that at least one recess (6, 14, 20, 24, 42) is formed so as to define the thin-walled portion (8a, 22a) which serves as an oscillator or transducer portion of the ceramic substrate. It is desirable that the second green sheet (second layer of the substrate) contain SiO or $SiO_2$, preferably in an amount of 0.5–5% by weight, more preferably 1–3% by weight. The addition of the silicon oxide in the specified amount is effective to avoid an excessive reaction of the second green sheet material with the piezoelectric/electrostrictive portion formed thereon during the heat-treatment, thereby improving the properties of the actuator produced.

For improving the operating response and increasing the amount of displacement of the actuator, the thickness of the second layer (8) of the ceramic substrate on which the piezoelectric/electrostrictive portion is formed is generally not larger than 50 µm, preferably not larger than 30 µm, and more preferably not larger than 15 µm, while the thickness of the first layer (4, 12, 18, 40) is generally at least 30 µm, preferably at least 50 µm, and more preferably at least 100 µm. For increased amounts of force and displacement of the actuator, the average ceramic particle size of the second layer is preferably held within a range of 0.1–2 µm, more preferably within a range of 0.1–1 µm.

While the ceramic substrate (2, 10, 16, 22, 38) consisting of the first and second layers may be suitably formed by firing the laminated green sheets, as indicated above, the substrate may be formed by other techniques such as press-forming, casting or injection molding process using a mold, and machining process in which a recess or recesses is/are formed in a suitably formed ceramic mass, by a ultrasonic machining, cutting or grinding operation. However, the green sheet lamination process is desirably used, since the substrate formed by this process does not have residual stresses as induced by the machining process, and has an accurately controlled thickness of the thin-walled portion. Where the green sheet lamination process is used, the first and second green sheets are first superposed one on the other, under heat and pressure, and then fired into the integrated ceramic substrate having the first and second layers corresponding to the two green sheets. Although the first and second green sheets do not have to have the same thickness, the materials of the two green sheets preferably have almost the same shrinkage due to firing thereof.

As indicated above, at least one recess (6, 14, 20, 42) may be formed in the ceramic substrate, by suitable machining or pressing process such as laser machining, ultrasonic machining or punch pressing, in place of the green sheet lamination process in which the second green sheet is formed with an aperture, cutout or other opening, as described above. In particular, the punch pressing process using a die and a punch is recommended for increased production efficiency of the substrate, and increased integration density of the thin-walled portions of the substrate (of the piezoelectric/electrostrictive units). Although the above machining or pressing process may be applied to a fired mass of a ceramic composition for the substrate, it is preferably applied to an unfired mass (already formed green sheet) of the ceramic composition.

The shape of the ceramic substrate, and the shape of the recess(es) formed in the substrate are not limited to the rectangular configurations as in the illustrated embodiments, and may be suitably modified, depending upon specific requirements and/or applications of the actuator to be produced. For example, the substrate and the recess may have circular, elliptical, oval, polygon, and other shapes such as a R-square and R-rectangle which have rounded corners, and may have a combination of these shapes.

On the ceramic substrate prepared as described above, there is formed a piezoelectric/electrostrictive portion in the following manner.

Where the piezoelectric/electrostrictive material is prepared in bulk, an unfired or green body for a piezoelectric/electrostrictive portion is formed of the material by a press forming process using a mold, or by a tape forming process using a slurry of the piezoelectric/electrostrictive material. The formed green body is then superposed on a thin-walled portion (8a) of an unfired ceramic substrate, under heat and pressure, and co-fired with the unfired ceramic body. In this case, electrode films or electrode pattern must be pre-formed, by a film-forming method described below, on the unfired ceramic substrate or on the unfired piezoelectric/electrostrictive body (green body) before the unfired bodies are superposed on each other.

In another method, the piezoelectric/electrostrictive green body formed as described above is first fired into a sintered body, and this sintered body is bonded by an adhesive to the surface of the thin-walled portion (8a) of the fired and sintered ceramic substrate. In this case, too, the electrode films or electrode pattern must be pre-formed on the unfired bodies for the piezoelectric/electrostrictive portion and ceramic substrate. As the adhesive, it is recommended to use an electrically conductive bonding agent.

The piezoelectric/electrostrictive material is fired at a temperature of about 800°–1400° C., preferably within a range of 1000°–1400° C. To avoid a change in the piezoelectric/electrostrictive composition, it is desirable to control the firing atmosphere, by heating with the evaporation source of the piezoelectric/electrostrictive material.

The piezoelectric/electrostrictive portion may be formed by a film-forming process as described below.

To form the electrode films (26, 30) and the piezoelectric/ electrostrictive film (28) on the ceramic substrate (22), it is possible to select any one of various known methods such as: thick-film forming process such as screen printing; coating process such as dipping; thin-film forming process such as ion-beam method, sputtering, vacuum vapor deposition, ion plating, CVD and plating. However, the other known methods may be used. For improved characteristics of the actuator produced, the piezoelectric/ electrostrictive film (28) is desirably formed by the screen printing or dipping method or coating process, which permits easy formation of a film on the substrate by using a paste or slurry whose major component piezoelectric/ electrostrictive powder. The film-forming process as indicated above permits the piezoelectric/electrostrictive portion to be formed integrally with the ceramic substrate, without using an adhesive agent, thereby improving the reliability and reproducibility of the actuator, and facilitate the integration of the piezoelectric/electrostrictive units on the substrate. In this respect, the film-forming process is recommended. Where the electrode and piezoelectric/ electrostrictive pattern (33, 36, 37, 39) is formed by this film-forming process, the screen printing or photolithography may be used. However, the pattern may be formed by removing unnecessary portions of the applied piezoelectric material by laser cutting, slicing or other mechanical machining methods.

The actuator as a whole, and the electrode and piezoelectric/electrostrictive films and patterns may take any desired configurations depending upon the utility of the actuator, such as triangular, rectangular and other polygonal shapes, circular, elliptical and annular shapes, comb-like or lattice-like configurations, and any combinations of these shapes.

The electrode and piezoelectric films and patterns (26, 28, 29, 30, 33, 36, 37, 39) formed on the ceramic substrate by the selected method described above may be either heat-treated in different steps for integration with the substrate after each of these films or patterns is formed, or concurrently heat-treated in one step for integration with the substrate after all of the films or patterns are formed into a laminar structure on the substrate. Where the thin-film forming process is used to form the electrode films or pattern, heat-treatment of the electrode films or pattern is not necessarily required.

The above-indicated heat-treatment for integration of the piezoelectric/electrostrictive portion with the ceramic substrate is generally effected at a temperature of about 800°–1400° C., preferably within a range between 1000° C. and 1400° C. To avoid a change in the composition of the piezoelectric/electrostrictive material during the heat-treatment process, it is desirable to control the heat-treatment atmosphere, by heating with the evaporation source of the piezoelectric/electrostrictive material.

The electrode films (26, 30) and pattern (33, 36) of the piezoelectric/electrostrictive portion may be formed of any electrically conductive material which can withstand oxidizing firing and heat-treatment atmospheres having a temperature as indicated above. For instance, the electrode films or pattern may be formed of a single metal, an alloy of metals, a mixture of a metal or alloy and an electrically insulating ceramic or glass, or an electrically conductive ceramic. However, it is preferred that the electrode material has a major component which consists of a noble metal having a high melting point, such as platinum, palladium or rhodium, or an alloy such as silver-palladium alloy, silver-platinum alloy or platinum-palladium alloy.

The ceramic material to be added to a metal or alloy to provide the above-indicated mixture for the electrode films or pattern is preferably the same as the ceramic material for the ceramic substrate or the piezoelectric or electrostrictive ceramic material used for the piezoelectric/electrostrictive film or pattern. Where the ceramic material for the ceramic substrate is used as an additive to the material for the electrode films or pattern, the content of the ceramic additive is preferably within a range of about 5–30% by volume. Where the piezoelectric or electrostrictive ceramic material is used as the additive, the content of the piezoelectric or electrostrictive ceramic additive is preferably within a range of about 5–20% by volume. It is particularly desirable to use a mixture of the ceramic material for the substrate and the ceramic material for the piezoelectric film or pattern, as a ceramic additive to be added to the material for the electrode films or pattern.

The electrode material as indicated above is advantageously used, where the electrode material is heat-treated with the piezoelectric/electrostrictive material or ceramic substrate material, or where the electrode material is exposed to a heat-treatment atmosphere for the piezoelectric/electrostrictive material. Where the electrode material is prepared in bulk, gold and silver may also be used for the electrodes if the electrodes are heat-treated independently of the other elements, or for the second electrode film (30).

While the thickness of the electrode films and pattern is suitably selected depending upon the application of the actuator, the electrode films (26, 30) used for the transverse-effect type piezoelectric/electrostrictive unit or units of FIGS. 11, 13, 14 and 16 are formed with a thickness not larger than 15 µm, preferably not larger than 5 µm. The electrode pattern (33, 36) used for the longitudinal-effect type piezoelectric/electrostrictive unit of FIGS. 12, 14 and 15 are formed with a thickness of at least 3 µm, preferably at least 10 µm, more preferably at least 20 µm.

The piezoelectric/electrostrictive films or pattern (28, 29, 37, 39) may be formed of any piezoelectric or electrostrictive material which produces a relatively large amount of strain or displacement due to the converse or reverse piezoelectric effect or the electrostrictive effect. The piezoelectric or electrostrictive material may be either a crystalline material or an amorphous material, and may be a semi-conductor material or a dielectric or ferroelectric ceramic material. Further, the piezoelectric or electrostrictive material may either require a treatment for initial polarization or poling, or may not require such a polarization treatment.

However, the piezoelectric/electrostrictive film or pattern preferably has a composition whose major component is lead zirconium titanate (PZT), lead magnesium niobate (PMN), lead nickel niobate (PNN), lead zinc niobate, lead manganese niobate, lead antimony stannate, lead titanate, barium titanate, or a mixture thereof. Further, a material (such as PLZT) containing an oxide or compound of lanthanum (La), barium (Ba), niobium (Nb), zinc (Zn), nickel (Ni) and/or manganese (Fin) may be added to the piezoelectric or electrostrictive composition whose major component consists of PZT.

In view of the construction of the piezoelectric/ electrostrictive actuator according to the present invention, the piezoelectric constant $|d_{31}|$ of the piezoelectric/electrostrictive material used is preferably at least $50\times10^{12}$ [C/N], more preferably at least $100\times10^{12}$[C/N], or the piezoelectric constant $|d_{33}|$ is preferably at least $100\times10^{12}$[C/N], more preferably $200\times10^{12}$[C/N], for assuring excellent operating characteristics of the actuator.

The piezoelectric/electrostrictive portion has a thickness not larger than 100 µm, preferably not larger than 50 µm, more preferably not larger than 30 µm.

While the present invention has been described in its presently preferred embodiments with a certain degree of particularity, it is to be understood that the invention is not limited to the details of the illustrated embodiments, but may be embodied with various changes, modifications and improvements, which may occur to those skilled in the art, without departing from the spirit and scope of the present invention defined in the following claims.

What is claimed is:

1. A method of producing a piezoelectric and/or electrostrictive actuator including a ceramic substrate and a piezoelectric and/or electrostrictive portion, comprising the steps of:

superposing on each other at least a first and a second green sheet which give, by firing thereof, a first layer and a second layer of said ceramic substrate, respectively, said first green sheet having at least one opening formed through a thickness thereof;

firing said first and second green sheets to form said ceramic substrate such that said Second layer cooperates with said at least one opening in said first layer to provide a vibratile or displaceable portion of said actuator, said vibratile or displaceable portion having a thickness not greater than 50 µm; and forming said piezoelectric and/or electrostrictive portion directly and substantially entirely on said vibratile or displaceable portion by a film-forming process, without an adhesive agent, followed by a heat treatment for integrating said piezoelectric and/or electrostrictive portion with said vibratile or displaceable portion.

2. The method of claim 1, wherein said first and second green sheets include at least one major component selected from the group consisting of aluminum oxide, magnesium oxide, zirconium oxide, aluminum nitride and silicon nitride.

3. The method of claim 1, wherein said ceramic substrate comprises zirconium oxide stabilized by at least one compound selected from the group consisting of yttrium oxide, ytterbium oxide, cerium oxide, calcium oxide and magnesium oxide.

4. The method of claim 1, wherein said first and second green sheets are superposed directly on each other and fired and integrated to provide said ceramic substrate.

5. The method of claim 1, wherein said film-forming process comprises the steps of forming a piezoelectric and/or electrostrictive film portion and at least one electrode film portion on said vibratile or displaceable portion.

6. The method of claim 1, wherein said vibratile or displaceable portion has an average ceramic particle size of 0.1–2 µm.

* * * * *